United States Patent [19]

Senderowicz et al.

[11] Patent Number: 4,794,349
[45] Date of Patent: Dec. 27, 1988

[54] FULLY DIFFERENTIAL, CMOS OPERATIONAL POWER AMPLIFIER

[75] Inventors: Daniel Senderowicz, Berkeley, Calif.; Germano Nicollini, Piacenza, Italy

[73] Assignee: SGS Microelettronica S.p.A., Catania, Italy

[21] Appl. No.: 82,608

[22] Filed: Aug. 7, 1987

[30] Foreign Application Priority Data

Aug. 8, 1986 [IT] Italy ............................ 83636 A/86

[51] Int. Cl.$^4$ ............................................. H03F 3/45
[52] U.S. Cl. .................................... 330/253; 330/258; 330/261
[58] Field of Search ............... 330/253, 255, 257, 258, 330/261, 259, 295, 146

[56] References Cited

U.S. PATENT DOCUMENTS 4,667,165  5/1987  De Weck ............................ 330/253

Primary Examiner—James B. Mullins
Attorney, Agent, or Firm—Pollock, Vande Sande & Priddy

[57] ABSTRACT

A fully differential, CMOS, operational power amplifier, particularly useful as output buffer in monolithic analog subsystems, includes an input differential stage, two gain stages and two output stages. Each output stage may be individually provided with a functional feedback loop and locally compensated for reestablishing sufficient stability. An output common mode control circuit, operable in a continuous or sampled manner, is also contemplated, as well as a special circuit for controlling the DC biasing current through the output stages under rest conditions. The amplifier may be used indifferently as a balanced (differential) output or as a single-ended output amplifier without any depression of its performances.

2 Claims, 6 Drawing Sheets

FULLY DIFFERENTIAL, CMOS OPERATIONAL POWER AMPLIFIER

BACKGROUND OF THE INVENTION

1. FIELD OF THE INVENTION

The present invention relates to high performances CMOS operational power amplifiers.

More generally, the present invention relates to monolithically integrated, semiconductor amplifiers and more in particular, to amplifiers integrated in complementary MOS (briefly CMOS) devices; i.e. in monolithic devices made on a single chip of semiconductor material, typically silicon, and wherein the active circuit elements (transistors, etc.) are generally of the unipolar, superficial field effect, n-channel and p-channel type; although it is possible to form on the same chip or semiconducting substrate also junction type bipolaractive elements for satisfying particular circuit requirements. Moreover, the invention is particularly useful for making analog subsystems in digital type integrated circuits, i.e. for implementing analog functions in integrated devices of the digital kind.

2. DESCRIPTION OF THE PRIOR ART

Lately the necessity (or usefulness of implementing analog and digital subsystems in the same monolithically integrated circuit, using the same fabrication technology, has become evermore frequent. For this reason, implementation of analog functions in the so-called MOS technology (Metal-Oxide-Semiconductor) assumes an ever greater importance and in particular the development of operational amplifiers made with surface field effect active elements has had a big increment.

The operational amplifier is in fact the key element, a real building block, of a great majority of analog systems; and its characteristics determine decisively the characteristics of the whole system.

Generally, within an analog-digital system the operational amplifiers are very simple because they must drive a load very well defined during design and very often purely capacitive with values of few picofarads. Therefore such "internal" operational amplifiers are easily optimized in their characteristics just for this particular function. On the other hand, such systems must necessarily "communicate" with the world outside the integrated circuit; and therefore they need an interface ensure a correct operation under different load conditions (outside the integrated circuit), the external load easily reaching up to several hundreds of picofarads and/or down to a minimum of about 1 Kohm.

For delivering analog type signals out from the I.C., an operational power amplifier is very often used.

The word "power" is herein utilized for signifying that the operational amplifier is capable of driving differentiated and heavy loads in respect to those normally driven within the integrated circuit itself.

A large variety of self-standing, multipurpose, integrated operational amplifiers are available, on the other hand, and are usable for various applications by following strictly the advice and suggestions indicated in the relative data sheets of these devices. These integrated, multipurpose operational amplifiers show generally excellent performances with the exception of the input currents levels, which are rather high, coinciding with the base currents of the bipolar transistors usually utilized in the input stage of the amplifier. Considering that in many applications, especially those wherein a high precision is required or more precisely, where extremely low input or biasing currents are required; for this reason, most of the I.C. producers have developed mixed technologies for integrating on the same silicon chip junction type field effect transistors (JFET) together with bipolar type junction transistors (BJT), thereby necessarily increasing the complexity of the fabrication processes as well as the number of masks necessary for making the integrated device.

Also, for reasons of somewhat different nature in respect to the problems strictly connected with the so-called output buffers of complex integrated systems, the development of new types of operational amplifiers using exclusively MOS type transistors has had a great impulse. MOS transistors, i.e. superficial field effect transistors, have the great advantage of truly negligible input currents.

It may be affirmed that there is a great need and request for operational power amplifiers having high performances and precision characteristics, made entirely with CMOS technology, for the most generalized applications, i.e. both as interface operational power amplifiers (output buffers) in analog-digital integrated systems as well as multipurpose, integrated operational amplifiers.

Typically, the block diagram of an operational power amplifier shows a differential input stage, a gain stage and an output stage. The dynamic characteristics (transient response, bandwidth, settling time) are determined exclusively by the first two stages, therefore the output stage must have a wide bandwidth and must not introduce an appreciable phase shift at the open loop cut-off frequency, determined by the first two stages, in order not to degrade the dynamic performances of the whole operational amplifier.

Other requirements of the output stage are a low output impedance (much smaller than that of the load), a large maximum swing of the output signal, i.e. a high peak value of the output voltage before clipping begins to take place, and the ability to deliver a high current to the load with relatively low total harmonic distortion, i.e. with high linearity.

There exists vast literature on the making of the first two stages as well as the output stage of operational amplifiers using exclusively MOS devices, e.g. "MOS Operational Amplifier Design—A Tutorial Overview", IEEE Solid State Circuits, Vol. SC—17, No. 6, December 1982; as well as the data books of I.C. manufacturers.

All CMOS operational power amplifiers described in literature are single-ended.

Frequently, the output stage used is the source-follower, that is, a stage formed by two p-channel or n-channel MOS transistors in common drain configuration, which provides a voltage gain lower than unity and a large current gain.

An output stage of this type is characterized by an extremely wide band and introduces a negligible phase shift at the open loop cut-off frequency. On the other hand it presents some important drawbacks; namely:

(a) the voltage swing on the load, positive in the case of a source-follower stage made with n-channel devices or negative in the case of a source-follower stage made with p-channel devices, is limited by the sum of the intrinsic characteristics of the two integrated MOS transistors, i.e. by the value of their cut-in threshold voltage, by the body-effect and by the overdriving;

(b) a limited ability of taking up current from the relative current generator.

With the aim of overcoming the first drawback, it has been proposed to use an emitter-follower output stage utilizing a junction type bipolar transistor in place of the MOS transistor, i.e. purposely forming a bipolar, junction type transistor on the CMOS chip, which is an already consolidated technique not requiring additional masks beside those normally used by the CMOS process.

However, this solution has drawbacks too; namely:

(i) a persistent limited capability of taking up current from the current generator;

(ii) the risk of degrading the gain of the preceding stage (operational amplifier) if the gain of the bipolar transistor is not very high, because the impedance seen from the base of such a bipolar transistor equals approximately the product between its $\beta$ and the resistance of the external load, and the possibility of encountering stability problems due to the low and hardly controllable cut-off frequency of such an integrated bipolar transistor;

(iii) possibility of establishing a parasitic SCR (Latch-up) caused by the collector current flowing through the substrate of the integrated circuit.

Another widely used solution is the class-AB output stage. The characteristics of this stage are practically very similar to those of the simple source-follower stage, though not presenting limitations on the capability of taking up or delivering current, respectively, from or to the load. Nevertheless this output stage has the drawbacks of an output impedance that is relatively high with respect to the load and that has a maximum swing of the output signal limited toward both supply rails.

An operational power amplifier, entirely made in CMOS technology and which does not show any of the above noted drawbacks, is described in literature ("Large Swing CMOS Power Amplifier" IEEE Journal of Solid State Circuits, Vol. SC—18, No. 6, December 1985). However, such an amplifier has a rather narrow bandwidth ($\cong$500 Khz) and a rather long settling time ($\cong$5 micro sec). Moreover, in this case also, the amplifier is a single-ended output amplifier.

In particular applications, at the output of integrated analog subsystems as well as in multipurpose, operational power amplifiers, it is necessary to drive a certain load in a balanced way. In these cases, generally, the solution adopted consists of sending the signal directly to the input of a single-ended operational amplifier, e.g. one of the above mentioned known types, and in sending the same signal, inverted, (i.e. the negative of the signal) to the input of another single-ended operational amplifier, identical to the first one. For inverting the signal, i.e. for obtaining the negative thereof, it is necessary to utilize a further operational amplifier, which must be theoretically ideal insofar as it must not modify any other characteristic of the input signal (e.g. it must not introduce an appreciable amplitude or phase distortion on the spectrum components of the input signal). A block diagram of such a system is shown in FIG. 1.

Such a solution is not free of drawbacks which are essentially attributable to the asymmetry of the circuit.

SUMMARY OF THE INVENTION

It is a main objective of the present invention to provide a CMOS operational power amplifier free of the above noted drawbacks shown by the CMOS operational power amplifiers of the prior art.

The present invention provides a fully differential, operational power amplifier wholly made in CMOS technology and which may be represented schematically as shown in FIG. 2.

The CMOS operational power amplifer of the present invention, in contrast to the known CMOS amplifiers, is fully differential and comprises a differential input stage, two parallel gain stages, two parallel output stages and a control circuit of the output common mode; each of the two output stages may have an individual feedback and be locally compensated for re-establishing a sufficient stability which could be prejudiced by introducing the feedback. Said output common mode control circuit is operable in a continuous way or alternately in a sampling manner by using a suitable clock generator.

According to a particularly preferred embodiment of the invention, the amplifier comprises means for stabilizing the quiescent or rest current, i.e. the current absorbed by the output stage in absence of a signal at the inputs of the operational amplifier, through a particular control cirucit which permits stabilization of the rest current even in the presence of remarkable intrinsic imbalances or of other accidental causes.

Each of the two output stages comprises at least two output transistors compensated by means of two feedback capacitors.

The operational amplifier of the invention is completely symmetric and offers remarkable advantages in respect to the prior art amplifiers, namely:

improvement of the maximum voltage swing of the output signal (the maximum swing is practically doubled);

improvement of the signal noise ratio (S/N): this is a direct consequence of the preceding feature; because, while the maximum swing of the output signal is improved by 6 dB, the noise is increased of 3 dB only;

improvement of harmonic distortion: this advantage is directly attributable to the symmetry of the circuit, because the even order distortions (particularly the second harmonic components which are generally the most responsible of the total harmonic distortion) are advantageously nullified;

improvement of the rejection ratio on the supply (PSRR): this advantage is also derived from the symmetry of the integrated amplifier's structure, in fact the two supply voltage rails are coupled in an equal measure to both the output terminals because of the equal path "seen", therefore the "difference" between the two couplings (that negatively influence the differential output voltage) results theoretically null;

improvement of the rejection with respect to couplings with other signals (e.g. with clock signals): this improvement is derived from the symmetry of the circuit too;

improvement of the input common mode rejection (CMRR): this characteristic, too, is improved by the symmetry of the amplifier's circuit.

BRIEF DESCRIPTION OF THE DRAWINGS

Purely for illustrative and nonlimitative purposes, the description of the invention will proceed with reference to the annexed drawings, some of which schematically show a particularly preferred embodiment of the invention, and wherein.

DESCRIPTION OF THE BEST MODE

Figure 1:
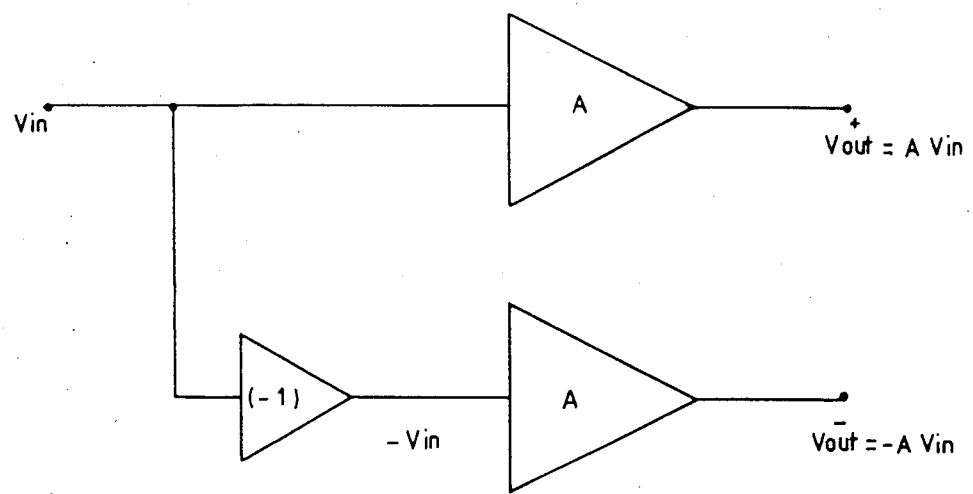
FIG. 1 is a block diagram of a typical circuit of the prior art for obtaining, from an input signal, two output signals from as many operational amplifiers, one being the negative of the other.
Figure 2:
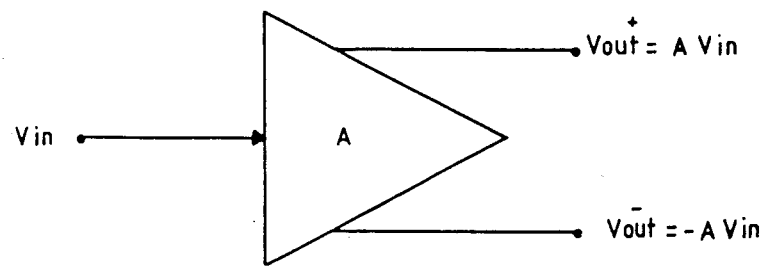
FIG. 2 is a schematic diagram of the fully differential, CMOS operational power amplifier of the present invention.
Figure 3:
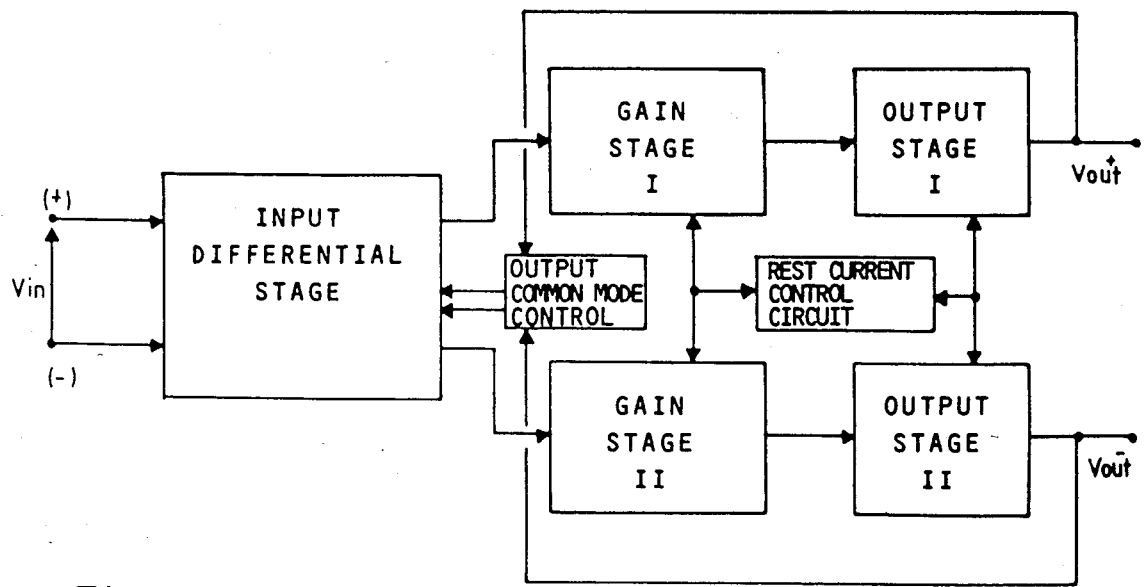
FIG. 3 is a block diagram of the stages composing an amplifier made in accordance with the present invention.

A basic block diagram of a preferred embodiment of the fully differential operational amplifier of the present invention is shown in FIG. 3.

In a fully differential structure, essentially, only the difference of the outputs' potentials ($V_{OUT} = V_{OUT+} - V_{OUT-}$) may be controlled through the difference of the inputs' potentials ($V_{IN}$), while it is impossible to control the average value of the outputs' potentials; i.e.: ($V_{OUT+} + V_{OUT-}$)/2, also called the "output common mode".

Clearly, in order to obtain the maximum possible swing of the output signals (the maximum dynamics) without having clipping problems, it is preferable to have such an output common mode always close to the average value of the supplies. To obtain this, the operational amplifier of the invention is provided with a dedicated circuit which forces the output common mode close to said average value of the two supply voltages, without, on the other hand, interfering in any way with the differential signal: $V_{OUT} = V_{OUT+} - V_{OUT-}$ and vice versa. The input differential stage of the amplifier is therefore provided with two auxiliary inputs for controlling the output common mode.

The two gain stages (I and II) are perfectly identical as are the two output stages (I and II) of the operational amplifier. Each of the output stages may therefore be provided with a feedback network in order to enhance the maximum swing and linearity characteristics of the output signal. The output stages are both locally compensated for re-establishing, in a sufficient measure, the stability characteristics depressed by introducing the feedback.

According to a particularly preferred embodiment of the amplifier, the rest current, that is the current absorbed by the output stages in absence of a signal at the input of the operational amplifier, is stabilized by means of a particular control circuit, which permits stabilization of the rest current even in the presence of remarkable intrinsic imbalances or of imbalances due to other accidental causes, thus checking and substantially reducing power dissipation.

DESCRIPTION OF THE SINGLE BLOCKS AT REST ($V_{IN}=0$ V)

Figure 4:
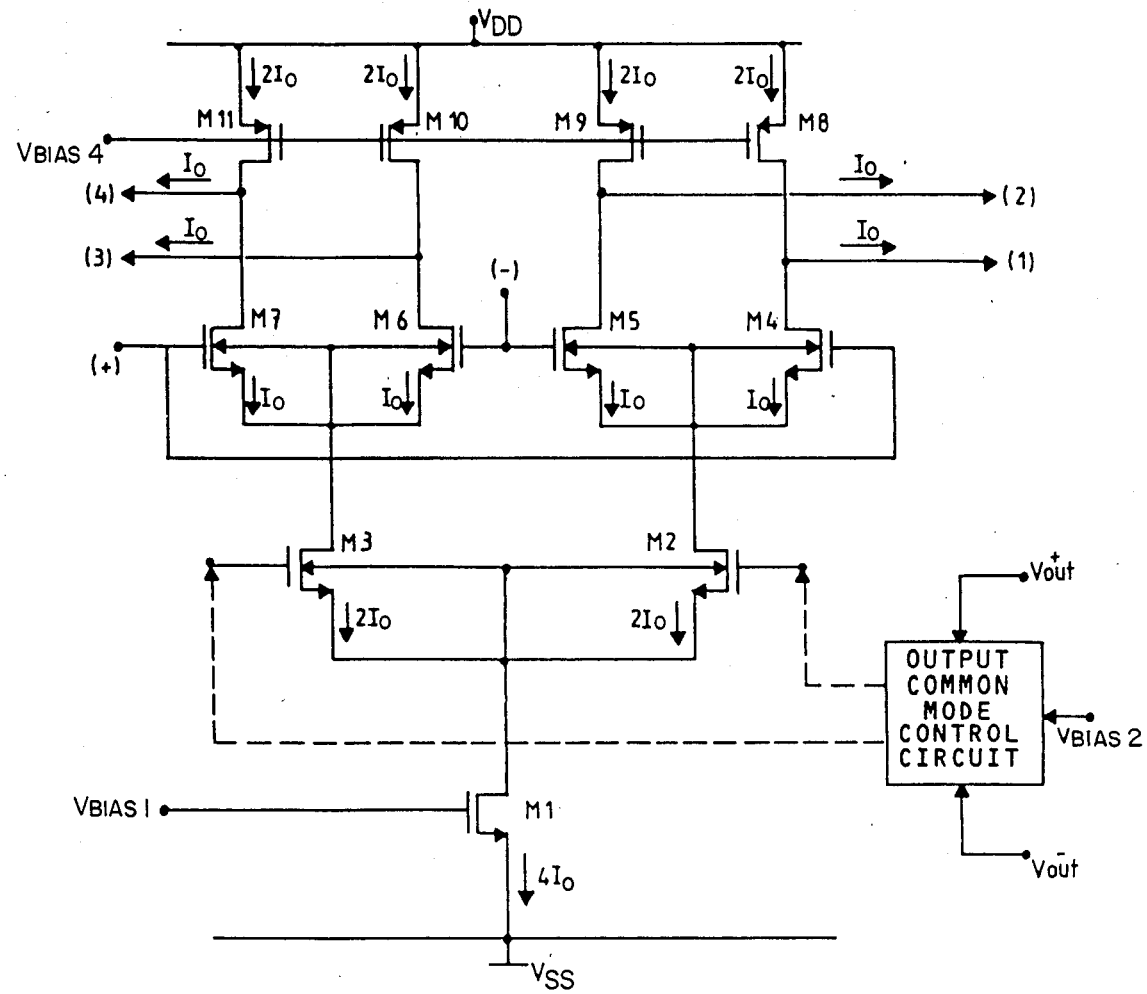
FIG. 4 is a circuit diagram of the input stage of the amplifier of FIG. 3.

An embodiment of the input stage is shown in the circuit diagram of FIG. 4.

The circuit comprises the constant current generators M1 ($4I_0$) and M8, M9, M10 and M11 ($2I_0$).

In rest conditions, i.e. when the input voltage $V_{IN}$ is null, the current $4I_0$ generated by M1 distributes equally between M2 and M3, which are the transistors whose gates constitute the auxiliary inputs for controlling the output common mode.

In turn, the current passing through the transistor M2 distributes equally between the two transistors M4 and M5.

In turn, the current passing through the transistor M3 distributes equally between the two transistors M6 and M7.

The transistors M4 and M7 have their respective gates connected in common and constitute the positive input terminal of the amplifier, the transistors M5 and M6 also have their respective gates connected in common and such a node constitutes the negative input terminal of the amplifier.

The differences between the relative rest currents of transistors M8, M9, M10 and M11 and, respectively, of transistors M4, M5, M6 and M7, indicated with $I_0$, flow into the following stages, respectively, at (1), (2), (3) and (4), i.e. into the two gain stages of the amplifier, as shown in FIG. 4.

The biasing voltages $V_{BIAS1}$, $V_{BIAS2}$ and $V_{BIAS4}$ are pre-set constant voltages, as are constant the two supply voltages $V_{DD}$ and $V_{SS}$.

Figure 5:
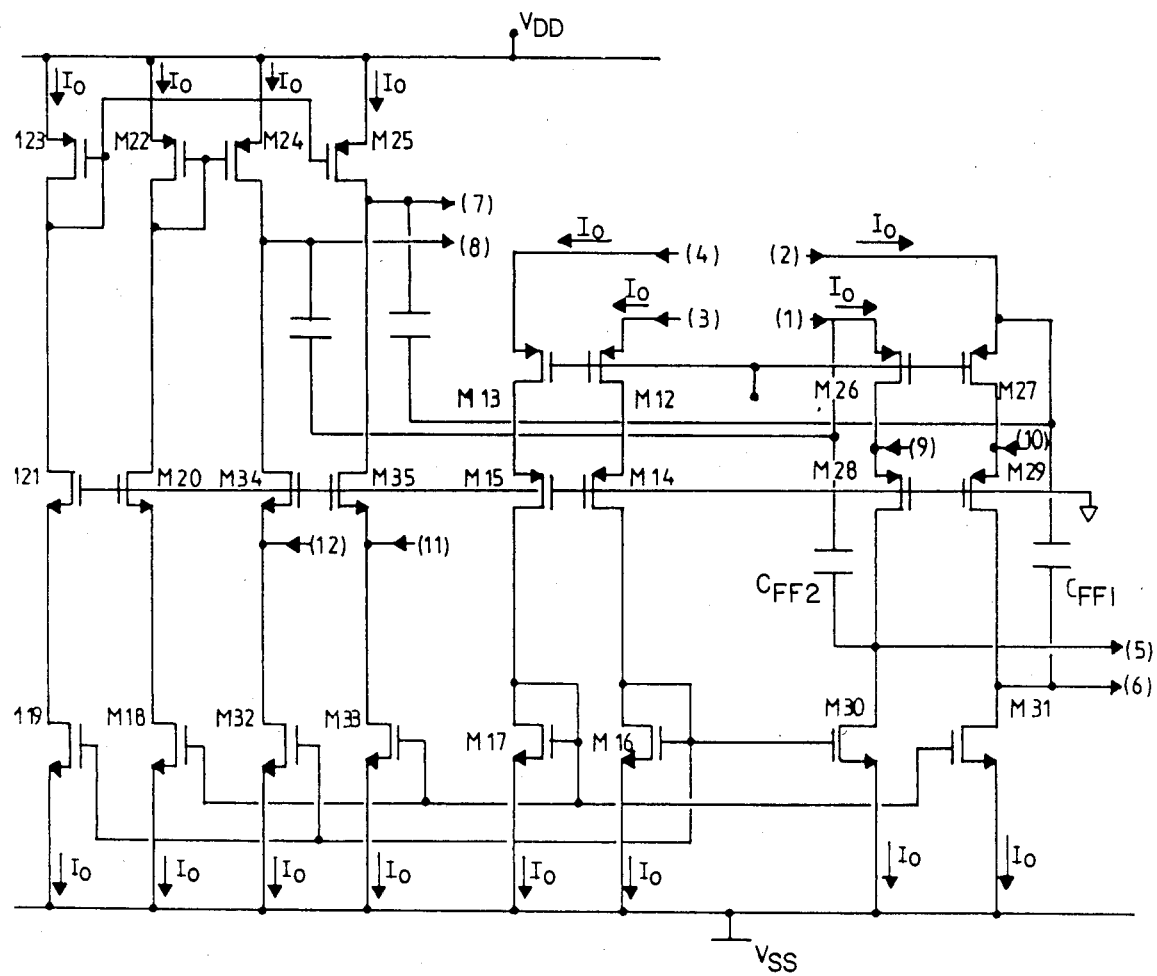
FIG. 5 is a circuit diagram of the two gain stages of the operational amplifier of FIG. 3.

In FIG. 5 is shown the circuit diagram of a preferred embodiment of the two gain stages of the operational amplifier of the invention.

The gain stage I is formed by transistors M26 and M28, which receive the rest current $I_0$ from (1); by transistors M12 and M14 receiving the rest current $I_0$ from (3); by transistor M16 operating as a current mirror for transistors M30, M32 and M19; by transistors M34 and M20 receiving the bias currents from transistors M32 and M18, respectively; and by transistor M22 operating as a current mirror for transistor M24.

The drain current of transistor M30, indicated with (5) and the drain current of transistor M28, indicated with (8), flow to the following input stage I. The two capacitors $C_{FF2}$ and $C_{FF4}$ serve for improving the high frequency characteristics of the gain stage I.

The gain stage II is similarly formed by transistors M27 and M29 which receive the rest current $I_0$ from (2); by transistors M13 and M15 which receive the current $I_0$ from (4); by transistor M17 operating as a current mirror for transistors M31, M33 and M18; by transistors M35 and M21 which receive the currents from transistors M33 and M19, respectively; and by transistor M23 which operates as a current mirror for transistor M25. The drain current of transistor M31, indicated with (6), and the drain current of transistor M25, indicated with (7), flow to the following output stage II. The capacitors $C_{FF1}$ and $C_{FF3}$ serve for improving the high frequency characteristics of this gain stage II. The voltage $V_{BIAS3}$ is a pre-set constant voltage.

Figure 6:
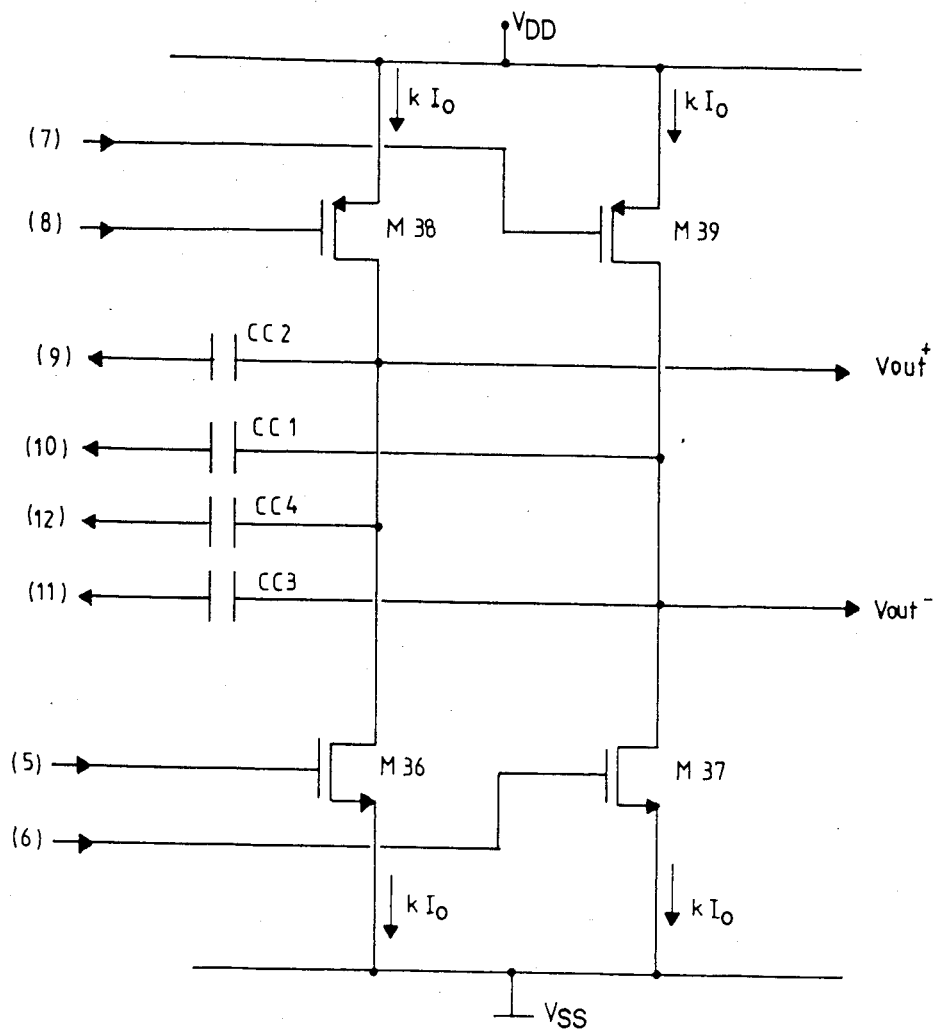
FIG. 6 is a circuit diagram of the two output stages of the operational amplifier of FIG. 3.

A preferred embodiment of the two output stages I and II of the operational amplifier of the invention is shown in the circuit diagram of FIG. 6.

The output stage I is formed by transistor M36 whose gate receives the signal coming from the drain node (5)

of transistor M30 of the preceding gain stage and by transistor M38 whose gate receives the signal coming from the drain node (8) of transistor M24 of the preceding gain stage.

The sizes of these two transistors M36 and M38 are such so as to circulate a rest current $kI_0$, where k is suitably set together with the values of the capacitors CC2 and CC4, which represent the compensation capacitors for re-establishing, in a sufficient measure, the stability characteristics of the path $V_{IN}$. . . $V_{OUT}+$ when a feedback network (not shown in the circuit diagrams of the figures) is applied to the operational amplifier in order to determine the desired function of the amplifier for the particular application.

The common drain of transistors M36 and M38 constitutes the $V_{OUT}+$ output terminal of the operational amplifier.

The output stage II, similar to the output stage I, is formed by transistor M37 whose gate receives the signal from the drain node (6) of transistor M31 of the preceding gain stage and by transistor M39 whose gate receives the signal coming from the drain node (7) of transistor M25 of the preceding gain stage.

The sizes of these two transistors M37 and M39 are designed in a similar way to those of the transistors M36 and M38, as well as the values of the compensation capacitors CC1 and CC3, so as to ensure the stability of the path $V_{IN}$. . . $V_{OUT}-$, when the operational amplifier is suitably provided with a feedback network.

The common drain of transistors M37 and M39 constitutes the $V_{OUT}-$ output terminal of the operational amplifier.

In both of the two output stages I and II, under particular circumstances, differences in the level of the rest current could arise with respect to the choosen pre-set value $kI_0$ attributed to it in designing the amplifier.

For example, at the outputs of the gain stages, i.e. at the inputs of the output stages, unbalance conditions in the two pairs of identical transistors M23 and M25 or M22 and M24 could arise such that, in the absence of a signal at the inputs of the operational amplifier, the gate of one of the transistors of the output stages could find itself at a lower potential with respect to the potential contemplated by the design; and such a circumstance would produce a strong increase of the current through such a transistor of one or of the other of the two output stages, in respect to the pre-set nominal value $kI_0$.

Supposing that this happens in the case of transistor M38 of the output stage I, and that, at the same time, a similar unbalance determined through the transistor M36 to a similar increase of the rest current in respect to the pre-set value $kI_0$, the rest output voltage $V_{OUT}+$ on the load will be substantially insensitive to the simultaneous increase of the rest current through both branches of the output stage I, so that the feedback network (not shown) of the path I of the operational amplifier cannot counterbalance such an increase of the rest current with the final consequence of an unchecked increase of the power dissipation under rest conditions by the operational amplifier.

Of course, the reverse situation may also happen, i.e. that caused by simultaneous unbalances a decrease of the rest current in respect of the pre-set value $kI_0$ with attendant problems of instability take place.

Therefore, in order to stabilize the rest current in the output stages of the fully differential amplifier and thus ensuring the stability of the output stages, a preferred embodiment of the amplifier of the invention comprises a special control circuit capable of detecting eventual unbalance conditions in absence of signal at the inputs of the amplifier and of re-establishing the correct conditions.

Figure 7:
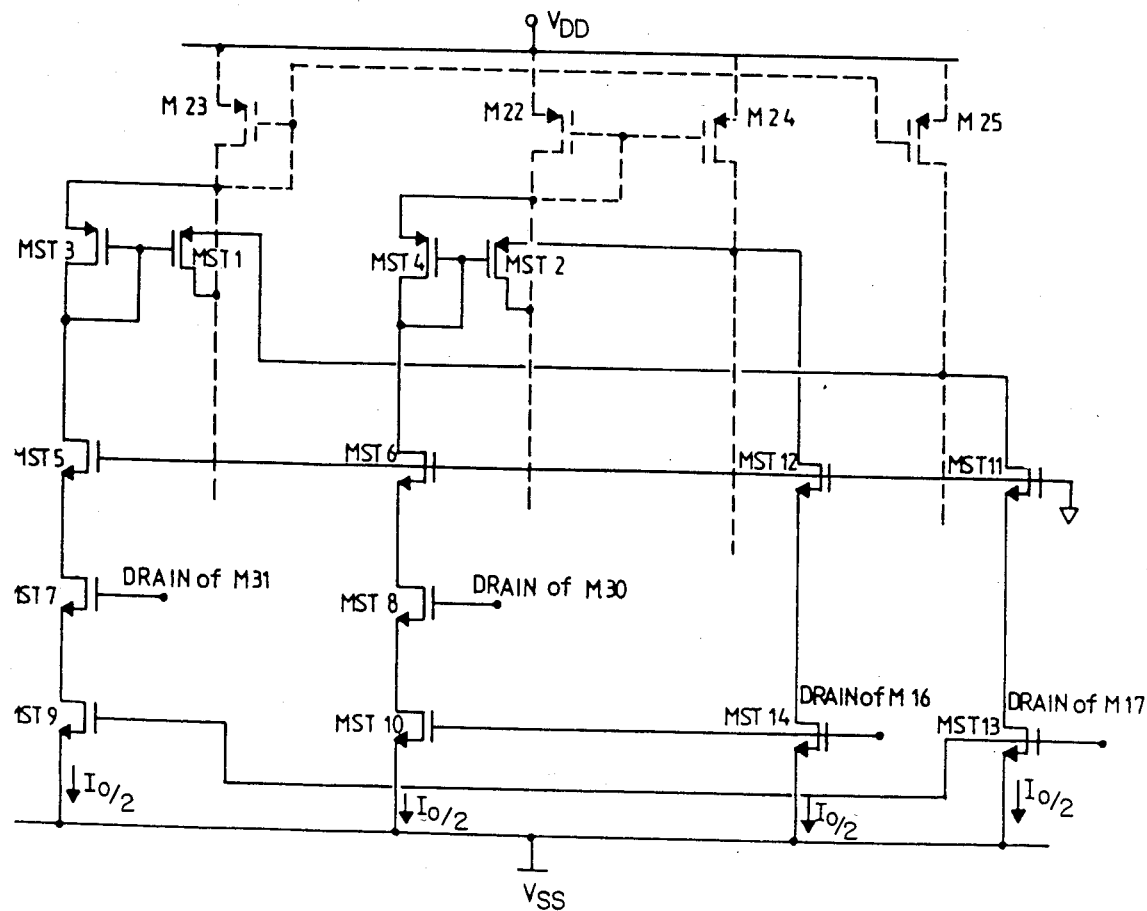
FIG. 7 is a circuit diagram of the output stage rest current control circuit of the operational amplifier of FIG. 3.

The output rest current control circuit may be realized as shown in the circuit diagram of FIG. 7.

The entire circuit is, more properly, formed by two identical circuits: one, formed by transistors MST2, MST4, MST6, MST8, MST10, MST12 and MST14, controls the rest current in the output stage I, while the other, formed by transistors MST1, MST3, MST5, MST7, MST9, MST11 and MST13, controls the rest current in the output stage II.

By dimensioning MST8=MST10=2×MST14 (and similarly MST7=MST9=2×MST13), if the drain potential of M30 (M31), which coincides with the gate potential of M36 (M37) and is responsible for the current $kI_0$ through the output transistors, is equal to the drain potential of M16 (M17), then the same current will flow through the two branches of MST8 (MST7) and MST14 (MST13) because the series of MST8 (MST7) and of MST10 (MST9) is equivalent to a transistor having the same dimensions of MST14 (MST13). The current of MST8 (MST7) will entirely flow in M22 (M23), through MST4 (MST3), increasing the rest current thereof and will obviously be mirrored into M24 (M25), this additional current flows into the branch of MST14 (MST13) without passing through MST2 (MST1). In this way the drain potential of M24 (M25) is equal to the drain potential of M22 (M23), which coincides also with the gate potential of M38 (M39) and therefore confirms the current $kI_0$ through the output stage I (II). If, for any reason (threshold inequalities, size differences, etc.), the drain of M30 (M31) is, for example, greater the drain potential of M16 (M17), then a current of MST8 (MST7) greater than that of MST14 (MST13) will flow.

The MST8 (MST7) current will always flow entirely into M22 (M23), always through MST4 (MST3), and will be mirrored into M24 (M25); but now, being prevented from flowing entirely through the MST14 (MST13) branch, a portion will flow into MST2 (MST1) thereby raising the drain potential to M24 (M25) with respect to the drain potential of M22 (M23), i.e. the gate potential of M38 (M39) is raised, thus reducing the output rest current.

In other words, the fact that the drain of M30 (M31), which coincides with the gate of M36 (M37), was at a greater potential than the drain of M16 (M17) should have caused an output current much greater than the nominal value $kI_0$, however the control circuit permits, according to the described manner of operating, to re-establish the correct value $kI_0$. Only for the illustrative purpose of explaining the operation of the control circuit, a "mismatch" between the transistor pairs M30 (M31) and M16 (M17) has been supposed, however the control circuit will act in the same way also in presence of any other mismatch condition on any transistor of the operational amplifier.

A characteristic of the control circuit of the rest current is that the circuit intervenes only and exclusively in the absence of a signal at the inputs of the amplifier; in fact, the presence of a signal at the inputs of the amplifiers ($V_{IN} \neq 0$) desactivates the rest current stabilization loop, thus permitting the output stage to develop the whole voltage across the load.

Figure 8:
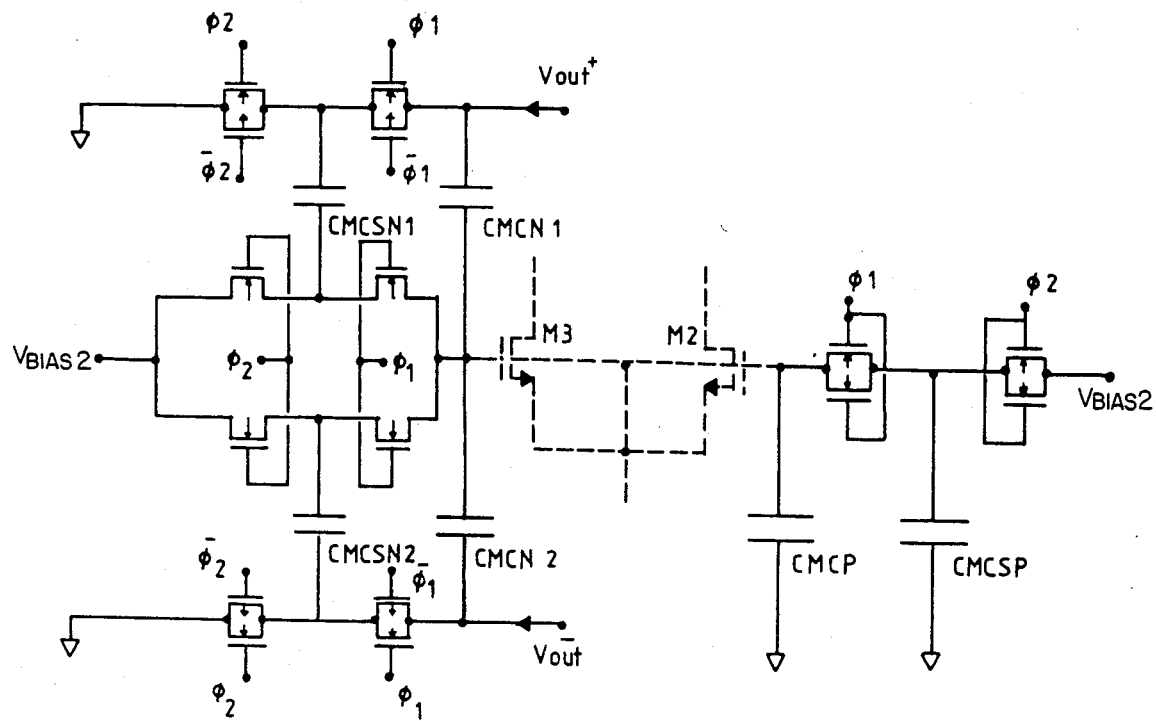
FIG. 8 is a circuit diagram of the output common mode control circuit of the operational amplifier of FIG. 3.

A preferred embodiment of the output common mode control circuit is shown in the circuit diagram of FIG. 8. The circuit is formed by a "continuous" capacitor (CMCP) connected between the gate of transistor M2 of the differential input stage of FIG. 4 and a reference voltage (in the shown example corresponding to the ground potential); by a switched capacitor (CMCSP) connected between the gate of transistor M2 and a reference voltage $V_{BIAS2}$, from one side, and connected to the same reference voltage to which is connected the continuous capacitor CMCP, from the other side thereof; by a continuous capacitor (CMCN1) connected between the positive output terminal $V_{OUT}+$ and the gate of transistor M3 of the input stage of FIG. 4; by a continuous capacitor (CMCN2), connected between the negative output terminal $V_{OUT}-$ of the amplifier and the gate of transistor M3; by a switched capacitor (CMCSN1), one terminal of which is switched alternatively from the output terminal $V_{OUT}+$ to a reference voltage (in the example shown corresponding to the ground potential), the other terminal of the capacitor being switched alternatively from the gate of transistor M3 to the reference voltage $V_{BIAS2}$; and by a switched capacitor (CMCSN2), a terminal of which is alternatively switched from the output terminal $V_{OUT}-$ to a reference voltage (in the example shown corresponding to the ground potential), the other terminal of the switched capacitor being alternatively switched between the gate of transistor M3 and the reference voltage $V_{BIAS2}$.

The above mentioned capacitors have capacitance ratios as shown herein below:

CMCSN1=CMCSN2
CMCN1=CMCN2
CMCSP=2×CMCSN1=2×CMCSN2
CMCP=2×CMCN1=2×CMCN2

The switches for effecting the necessary commutations are shown in the circuit diagram of FIG. 8 and for each one of them the clock signals determining the low resistance condition of the n-channel transistor switches are shown as $\Phi_1$ and $\Phi_2$ and conversely $\overline{\Phi}_1$ and $\overline{\Phi}_2$ for p-channel transistor switches.

Such switching signals $\Phi$ and their inverse (opposites) $\overline{\Phi}$ are suitably generated by means of a clock signal generator and the signals must be of the non-overlapping type.

The operation of such a sampling control circuit of the common mode is easily comprehended. The capacitor CMCSP, continuing to commute from $V_{BIAS2}$ to the gate of M2, charges the capacitor CMCP to a continuous voltage equal to $V_{BIAS2}$.

CMCSN1 and CMCSN2, continuing to commute, charge CMCN1 and CMCN2, respectively, to a continuous voltage equal to the difference between a reference voltage (in the example shown corresponding to the ground potential) and $V_{BIAS2}$.

Now, the gate of M2 being at the potential of $V_{BIAS2}$, the only equilibrium condition of such a circuit is that the gate of M3 also assumes a potential equal to $V_{BIAS2}$ and consequently that the other terminal of capacitors CMCN1 and CMCN2 assumes a potential equal to the reference potential (which in the example shown corresponds to the ground potential).

Naturally, other known types of control circuits for the common mode, operating in a sampled or in a continuous manner, may also be utilized in the operational amplifier of the present invention.

OPERATION OF THE AMPLIFIER IN PRESENCE OF AN INPUT SIGNAL ($V_{IN} \neq 0$)

The presence of a signal coupled to the differential input terminals of the operational amplifier is detected as an unbalance of the currents flowing through the input stage transistors M4, M5, M6 and M7 and therefore also of the currents flowing out of nodes (1), (2), (3) and (4).

Supposing, in fact, that the (+) input terminal is more positive than the (−) input terminal, the currents flowing through transistors M7 and M4 would increase while the currents flowing through transistors M6 and M5 would decrease; consequently the currents toward (3) and (2) increase and the currents toward (1) and (4) decrease.

The unbalance among the currents is equal to the product of the input signal level and the transconductance of the input differential stage of the amplifier.

This current imbalance, after having been mirrored, is finally detected at the nodes indicated with (5), (6), (7) and (8) as a voltage unbalance.

In the particular example described above, the potential of the nodes (5) and (8) falls while the potential of the nodes (6) and (7) rises. The voltage unbalance of such nodes is equal to the current unbalance multiplied by the impedance seen from these nodes, which impedance is notably extremely high.

The output stages of the amplifier detect such a voltage unbalance of the nodes (5), (6), (7) and (8) and convert it into a current unbalance equal to the said voltage unbalance multiplied by the relative transconductance of the output stages.

Again, for the above described case, the current through the transistors M37 and M38 increases while the current through transistors M36 and M39 decreases, and such current difference between M36 and M38 is delivered to the external load of the amplifier, while the current difference between transistors M37 and M39 is drawn from the external load, thus developing a positive signal in the first case and a negative signal in the second case across the same external load.

Naturally, as it will be clear to the skilled technician, such a behavior description in the presence of a signal at the input of the operational amplifier remains valid for low frequencies wherein capacitive effects may be neglected. Of course, at high frequencies such capacitive effects must be taken into account and therefore the description of the operation of the amplifier is no longer so immediate though being easily analyzable by a skilled technician. In any case, the local compensation in both the output stages, realized by means of the capacitors CC1, CC2, CC3 and CC4, is capable of ensuring a sufficient stability, necessary for a correct operation of the operational amplifier when the latter is provided with an appropriate feedback depending on the function which the operational amplifier is called to perform.

The fully differential operational amplifier object of the present invention is realized entirely in CMOS technology, i.e. with complementary MOS transistors, and may therefore be easily integrated in modern complex analog/digital systems. Also as a self-standing operational amplifier, i.e. as a multipurpose integrated device, the amplifier of the invention is extremely advantageous in applications wherein driving a load in a balanced manner is preferable or necessary.

The amplifier of the invention offers a series of important advantages in respect to the more traditional, single-ended, operational amplifier of the prior art; namely:

(1) the amplifier is fully differential and thus offers all the advantages of a symmetric structure, already pointed out;

(2) the amplifier may drive balanced loads without the need of an additional amplifier (ideal) for inverting the input signal;

(3) the amplifier of the invention may be utilized also as a single-ended amplifier utilizing one or the other of its two output terminals without incurring any degradation of the amplifier's characteristics;

(4) the voltage swing of the output signal may be equal to the supply voltages $V_{DD}$ and $V_{SS}$;

(5) there is not any substantial limitation to the current delivered to the external load because the difference between the gate and source potential of the transistors of the two output stages may be very large;

(6) the output impedance is relatively low because both the output stages are locally compensated; they are, therefore, capable of driving resistive loads up to 100 ohms and capacitive loads up to 400 pF without degradation of the stability characteristics.

The CMOS integrated operational power amplifier of the present invention, illustrated with reference to the circuit diagrams of FIGS. 4, 5, 6, 7 and 8, may be also realized interchanging the polarities by suitably varying the sizes of the transistors.

In general, although the invention has been described in reference to a particular preferred embodiment thereof, it is intended that the invention be not limited to such an example, vice versa, the skilled technician will easily recognize different alternatives and modifications which may be applied to the circuit diagrams herein described without departing from the spirit and scope of the present invention.

What we claim is:

1. A fully differential, CMOS, operational power amplifier, operable to produce signals at two differential output terminals in accordance with a signal applied to two differential input terminals, comprising:

an input differential stage, having a first input node constituting one input terminal of the amplifier and a second input node constituting the other input terminal of the amplifier, operable to produce differential output signals at two pairs of differential output terminals thereof in accordance with said signal applied to said input terminals of the amplifier;

a first and second gain stage, each having two differential input terminals respectively coupled to one of said pairs of differential output terminals of said input differential stage to produce differential output signals at a pair of respective differential output terminals;

a first and a second complementary, common source configured output stage, each having two differential input terminals respectively coupled to one of said pairs of differential output terminals of one of said two gain stages to produce an output signal at one of said differential output terminals of the amplifier in accordance with said differential output signals of said respective one of the two gain stages;

means for controlling the DC biasing current flowing through said output stages under rest condition;

said input differential stage having duplicated differentially coupled input transistor pairs, each producing one of said output signals at the respective pair of said differential output terminals, both differentially coupled input transistor pairs sharing a common constant current source which imposes a biasing current on both differentially coupled input transistor pairs through an intervening third differentially coupled transistor pair having a first and a second input terminal;

a switched capacitor output common mode control circuit comprising a capacitive voltage divider connected across said differential output terminals of the amplifier and having a central node directly connected to the first input terminal of said intervening third differentially coupled transistor pair of the input differential stage and through switched capacitor means to a reference voltage source, the second input terminal of said intervening third differentially coupled transistor pair being substantially connectable through switched capacitor means to the same reference voltage source;

said switched capacitor control circuit providing an output common mode feedback signal which is applied to the input stage by means of said third differentially coupled transistor pair for counterbalancing any output common mode voltage.

2. The amplifier according to claim 1, wherein each of said output stages is provided with a capacitive compensation local feedback.

* * * * *